METHOD FOR MANUFACTURE OF SEMICONDUCTOR DEVICES

Filed March 15, 1963

INVENTORS
Harland C. Andrews
Benjamin W. Thomas

BY Giles C. Clegg Jr.

ATTORNEY

United States Patent Office 3,215,570

Patented Nov. 2, 1965

3,215,570
METHOD FOR MANUFACTURE OF SEMICONDUCTOR DEVICES

Harland C. Andrews, Juno Beach, Fla., and Benjamin W. Thomas, San Jose, Calif., assignors to Texas Instruments Incorporated, Dallas, Tex., a corporation of Delaware Filed Mar. 15, 1963, Ser. No. 266,153
5 Claims. (Cl. 148—187)

Figure 1:
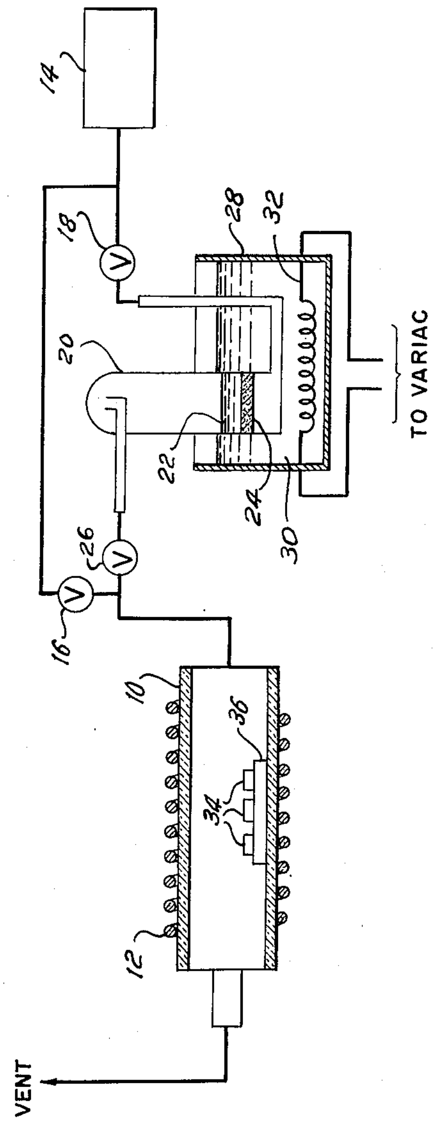

Many types of electronic devices are fabricated from semiconductor materials by providing a desired distribution and concentration of particular impurity materials within the semiconductor body to form rectifying junctions and regions of controlled resistivity. The semiconductor materials usually are germanium and silicon from Group IV–A of the Periodic Table.

The elements most usually used as impurity material for imparting P-type conductivity to Group IV–A semiconductors are boron, aluminum, gallium and indium. Of the P-type impurities, aluminum diffuses at the fastest rate assuming equal concentrations and diffusion temperatures. Because of its very fast diffusion rate, it is possible to obtain junction gradations that are not possible with other P-type conductivity impurities. It is also possible to control the diffusion of aluminum to a high degree and to obtain very high concentrations of aluminum since the solubility of aluminum in silicon is quite high, and higher than the solubility of other impurity materials such as gallium.

Due to the above advantageous characteristics of aluminum as a P-type impurity material, aluminum was used quite extensively as a P-type impurity for semi-conductor materials and particularly for silicon during that phase of the semiconductor technology when grown junction type crystals were most widely used. However, as the semiconductor technology progressed, vapor diffusion techniques were developed. Most present day semiconductor devices are manufactured by utilizing vapor diffusion techniques in order that extremely narrow regions of controlled resistivity may be obtained for improving operating characteristics. Also, diffusion techniques have made possible a planar type structure which appears to offer advantages in reliability. Most significant, however, is the great flexibility in device configuration that can be obtained by utilizing diffusion techniques.

Aluminum has not proved acceptable as an impurity material for use in vapor diffusion techniques because of the difficulty in achieving a desired concentration of aluminum in the semiconductor material. Thus, attempts to diffuse aluminum into silicon by evaporating a small quantity of the aluminum onto the surface of the semiconductor body have, in general, proved unsuccessful as even an extremely small amount of aluminum evaporated onto the surface of the body will alloy with the body at diffusion temperatures. In most diffusion processess, even a slight amount of alloying is extremely undesirable.

According to the present invention, an improved method for diffusing aluminum into a semiconductor body is provided wherein the semiconductor body is exposed to an atmosphere containing the vapors of an oxygen free, organic aluminum compound at a temperature sufficient to produce deposition of elemental aluminum onto the semiconductor body from the vapors of said compound. The semiconductor body is then heated to diffuse the deposited aluminum into the semiconductor body. The deposition and diffusion may be made to occur simultaneously or sequentially.

In accordance with the preferred embodiment of the invention, an organic aluminum compound devoid of oxygen is introduced into a stream of inert or reducing gas and passed across a semiconductor wafer in a reaction chamber maintained at a temperature sufficient to produce pyrolytic decomposition or reduction of the organic aluminum compound. The temperature of the reaction chamber and the concentration of the organic aluminum compound in the gas stream are controlled to produce the desired surface concentration of aluminum and insure that excessive aluminum is not deposited onto the surface of a semiconductor body to produce substantial alloying.

The deposition of aluminum can occur at a temperature sufficient to produce the desired diffusion or the deposition of the aluminum can proceed at a temperature lower than that necessary to produce substantial diffusion of the aluminum into the semiconductor body. After the desired amount of aluminum is deposited, the semiconductor body is subjected to an appropriate temperature to produce additional diffusion of the impurity of the aluminum into the semiconductor body if required. Suitable methods, such as oxide masking techniques, may be utilized to restrict and define the areas into which aluminum is to be diffused.

Figure 2:
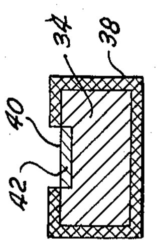

Many objects and advantages of the present invention will become apparent to those skilled in the art as the following detailed description of the same unfolds when taken in conjunction with the attached drawing in which:

FIGURE 1 diagrammatically illustrates apparatus suitable for practicing certain preferred embodiments of the present invention; and FIGURE 2 is a cross sectional view illustrating the results of the present invention.

Turning now to FIGURE 1 of the drawing, there is shown a reactor tube 10 which is preferably of quartz. Resistance coils 12 may be provided for heating the reactor tube 10 or other suitable means may be employed. The reactor tube 10 is suitably of the type adapted for an open diffusion process. A source 14 of an inert or reducing carrier gas is provided. The source 14 of carrier gas is connected through a valve 16 to the inlet of the reactor tube 10. The source 14 of carrier gas is also connected through a valve 18 to a wash bottle of the type commonly used in the semiconductor art. The wash bottle is denoted by the reference numeral 20 and contains a liquid, oxygen free, organic aluminum solution 22. As shown, the carrier gas passing through the valve 18 is admitted into the wash bottle 20 at a point below the surface of the aluminum compound such that the carrier gas flowing through the valve 18 will bubble through the liquid aluminum compound causing the vapors of the aluminum compound to be picked up and carried by the gas stream. A disk 24 of coarse porosity glass frit may be provided to insure that the stream of carrier gas will be saturated with the aluminum compound. The gas stream flows through the wash bottle 20 and passes through valve 26 to the reactor tube 10. Means such as the container 28 filled with a liquid 30 and heated by a heating element 32 are provided for maintaining the aluminum compound at a temperature to provide the desired vapor pressure within the wash bottle 20.

In practicing the present invention, the semiconductor wafers 34 into which aluminum is to be diffused may be supported within the reactor tube 10 on a quartz boat 36. As shown in FIGURE 2, the surface of each of the wafers 32 is suitably covered with an oxide layer 38 on the areas in which diffusion is not desired. The oxide layer 38 provides a very effective diffusing mask as the aluminum vapors will not penetrate the oxide layer to an appreciable extent, even though the oxide layer may be extremely thin. The oxide layer may be formed by any suitable method such as, for example, passing wet oxygen or steam over the surface of the semiconductor body while maintaining the semiconductor body at an elevated temperature. Thereafter, photographic masking techniques of the type normally used in the semiconductor industry may be utilized for selectively removing the oxide film from the portion 40 of the semiconductor body into which diffusion is desired. The area from which the oxide film is removed may be of any desired size and configuration. It will be appreciated that the oxide mask is necessary only if it is desired to restrict the area into which the aluminum is to be diffused.

Thereafter, the reactor tube 10 is heated to produce the desired temperature within the reactor tube and flushed with the carrier gas by opening valve 16. After the reactor tube 10 is flushed with the carrier gas and the reactor 10 has attained the desired temperature, the valve 16 is closed and the valves 18 and 26 are opened allowing the carrier gas to bubble through the aluminum compound and pass over the surface of the semiconductor bodies 34 with a small amount of the aluminum compound entrained within the gas stream. As the gas stream containing the aluminum compound passes through the reactor 10, elemental aluminum is deposited onto the semiconductor bodies. The amount of aluminum deposited can be controlled by varying the flow rate of the gas stream, the temperature of the reactor 10 and the concentration of the aluminum compound in the gas stream.

According to one embodiment of the invention, an aluminum alkyd compound, triethyl aluminum, was the oxygen free organic aluminum compound utilized as a source of aluminum and the semiconductor body was a silicon wafer of N-type conductivity having a resistivity of 4 ohm-centimeters. An oxide film was formed on the silicon body by flowing wet nitrogen over the silicon wafer at a temperature of 1200° C. for one hour. After formation of the oxide layer, conventional photographic techniques were utilized for removing the oxide layer from selected portions of the silicon wafer. The oxide mask silicon wafer was then placed in the reactor tube. The temperature of the reactor tube was raised to 1200° C. and the reactor tube was flushed with hydrogen. The hydrogen gas stream was then caused to bubble through the triethyl aluminum at a flow rate of 0.7 liter per minute. The triethyl aluminum was maintained at a temperature of 25° C. After 30 minutes, the slice of silicon was removed from the reactor chamber, lapped, stained and the junction depth measured. The depth of the PN junction was 0.00008 inch and the surface concentration of aluminum was approximately $2\times10^{18}$ atoms per cubic centimeter. Diffusion occurred only in the areas where the oxide mask was removed. There was no evidence of alloying of the aluminum to the silicon body.

According to a second embodiment of the invention, a silicon wafer was prepared in the manner described above. The oxygen free, organic aluminum compound utilized in this second embodiment was triisobutyl aluminum. The temperature of the tri-isobutyl aluminum was 25° C. and the flow rate of the hydrogen carrier gas through the wash bottle was 0.7 liter per minute. The temperature within the reactor tube was 800° C. After 45 minutes, the flow of hydrogen through the wash bottle was stopped and the temperature of the reactor tube was increased to 1200° C. to diffuse the deposited aluminum into the silicon body. Wet nitrogen was passed over the silicon wafer during the time that the wafer was maintained at a temperature of 1200° C. to prevent damage to the surface of the wafer. After one hour, the silicon wafer was removed from the reactor chamber, lapped, stained and the junction depth measured. The depth of the PN junction was 0.00014 inch and the surface concentration of aluminum was approximately $4\times10^{18}$ atoms per cubic centimeter. Diffusion occurred only in the areas where the oxide mask was removed and there was no evidence of alloying.

By suitably controlling the amount of aluminum deposited, the rate at which the aluminum is deposited, the temperature during the deposition process and, if utilized, the temperature during the additional diffusion period, virtually any desired surface concentration and concentration gradient within the diffused layer can be obtained. As the oxide mask provides a very effective diffusion barrier, diffused regions of any desired configuration can be provided.

The deposition of the aluminum from the vapors of the organic aluminum compound can be produced either in a reduction process or by pyrolytic decomposition of the aluminum compound. Thus, either a reducing gas, such as hydrogen, or an inert gas, such as nitrogen, or helium can be used as the carrier gas.

Although the invention has been described only with regard to certain specific examples in which silicon is utilized as the semiconductor material, the principles of the present invention also find utility in the diffusion of aluminum into other semiconductor materials capable of withstanding the temperatures at which aluminum is deposited and in which aluminum provides the desired conductivity type determining function. Aluminum alkyds other than the ones specifically disclosed herein can be utilized in practicing the process provided by the present invention, and other organic aluminum compounds, such as the aluminum aryls can also be used. The invention is to be limited not to what has been specifically disclosed herein but only as necessitated by the scope of the appended claims.

What we claim is:

1. In the manufacture of semiconductor devices, the steps of exposing a silicon semiconductor body to an atmosphere containing the vapors of an oxygen free, organic aluminum compound, said aluminum compound being selected from the group consisting of triethylaluminum and tri-isobutylaluminum, at a temperature sufficient to produce deposition of elemental aluminum onto the semiconductor body from the vapors of said compound and heating said body for diffusion of the deposited aluminum into said body.

2. In the manufacture of semiconductor devices, the steps of exposing a silicon semiconductor body to the vapors of triethyl aluminum at a temperature in the order of 1200° C. to produce deposition of elemental aluminum onto said body and heating said body for diffusion of the deposited aluminum into said body.

3. In the manufacture of semiconductor devices, the steps of exposing a silicon semiconductor body to the vapors of tri-isobutyl aluminum at a temperature in the order of 800° C. to deposit elemental aluminum onto said body and thereafter heating said body for diffusion of the deposited aluminum into said body.

4. A method of manufacture as defined in claim 3 wherein said body is heated to a temperature in the order of 1200° C. in the presence of wet nitrogen.

5. In the manufacture of semiconductor devices, the steps of forming an oxide film on the surface of a silicon body, selectively removing the oxide film from the portions of the body in which diffusion of aluminum is desired, subjecting said silicon body to the vapors of an oxygen free aluminum alkyd compound, said aluminum compound being selected from the group consisting of triethylaluminum and tri-isobutylaluminum, at a temperature sufficient to produce deposition of elemental aluminum onto said semiconductor silicon body from the vapors of said compound, and heating said body for diffusion of the aluminum into said silicon body to form aluminum diffused regions in said body where said oxide film was selectively removed.

References Cited by the Examiner

UNITED STATES PATENTS

| | | | |
|---|---|---|---|
| 2,695,852 | 11/54 | Sparks | 117—131 |
| 2,796,562 | 6/57 | Ellis | 148—187 |
| 2,841,510 | 7/58 | Mayer | 148—188 |
| 2,843,474 | 7/58 | Ziegler | 75—68 |
| 2,867,546 | 1/59 | MacNevin | 117—107 |
| 3,044,147 | 7/62 | Armstrong | 148—186 |
| 3,055,776 | 9/62 | Stevenson | 148—189 |

FOREIGN PATENTS

| | | |
|---|---|---|
| 136,476 | 5/60 | Russia. |

OTHER REFERENCES

Aschner et al.: Journal of the Electrochemical Soc., May 1959, pp. 415–417.

BENJAMIN HENKIN, *Primary Examiner.*